(12) United States Patent
Marinissen et al.

(10) Patent No.: US 6,721,911 B1
(45) Date of Patent: Apr. 13, 2004

(54) METHOD AND APPARATUS FOR TESTING A MEMORY ARRAY USING COMPRESSED RESPONSES

(75) Inventors: Erik J. Marinissen, Eindhoven (NL); Guillaume E. A. Lousberg, Eindhoven (NL); Paul Wielage, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 423 days.

(21) Appl. No.: 09/624,476

(22) Filed: Jul. 24, 2000

(30) Foreign Application Priority Data

Jul. 22, 1999 (EP) ............................................. 99202416

(51) Int. Cl.$^7$ .............................................. G11C 29/00
(52) U.S. Cl. ...................................... 714/718; 365/201
(58) Field of Search ................................ 714/735, 718, 714/710, 724; 365/201; 702/185

(56) References Cited

U.S. PATENT DOCUMENTS

| | | | |
|---|---|---|---|
| 4,586,178 A | * 4/1986 | Bosse ........................... | 371/10 |
| 5,020,011 A | * 5/1991 | Stark et al. .................. | 364/580 |
| 5,568,437 A | * 10/1996 | Jamal .......................... | 365/201 |
| 5,577,050 A | * 11/1996 | Bair et al. .................. | 371/10.2 |
| 5,717,694 A | 2/1998 | Ohsawa | |
| 6,360,340 B1 | * 3/2002 | Brown et al. ................ | 714/718 |

FOREIGN PATENT DOCUMENTS

WO 9822951 A1 5/1998

* cited by examiner

*Primary Examiner*—Albert Decady
*Assistant Examiner*—Dipakkumar Gandhi

(57) ABSTRACT

A memory array, and in particular, an embedded memory array is tested by interfacing to a stimulus generator and a response evaluator pair. In a non-test condition the pair is steered in a transparent mode, and in a test condition in a stimulus generating mode and a response evaluating mode respectively. In a subsequent array repair condition row and/or column-based repair intervention are allowed. In particular, the evaluator will evaluate correspondence between successive fault patterns, and further in a fault response signalizing mode to external circuitry on the basis of a predetermined correspondence between an earlier fault pattern and a later fault pattern signalize one of the two compared patterns only in the form of a lossless compressed response pattern.

11 Claims, 3 Drawing Sheets

METHOD AND APPARATUS FOR TESTING A MEMORY ARRAY USING COMPRESSED RESPONSES

BACKGROUND OF THE INVENTION

The invention relates to a method as recited in the preamble of claim 1. Stand-alone memory integrated circuit chips have been growing in size during many years. Large-size memories, and in particular DRAMs, suffer from low manufacturing yield. It has become common practice to provide such memory arrays with spare rows and/or columns that may be used after testing to repair a faulty array by replacing a faulty row or column, respectively. In common manufacturing practice, a 2% redundancy may triple manufacturing yield. Testing of memory arrays has become a refined art, based on presenting the array with many test stimuli with a prescribed content and in a prescribed sequence, and subsequently reading the stored content for comparison with the expected response. The combination of stimulus and expected response is sometimes called the test pattern.

Of late, processing or similar other circuitry has been combined with a large amount of so-called embedded memory. The nature of such other circuitry is not critical to the present invention, inasmuch as it may be a conventional instruction-based processor, a single-purpose digital logical circuit, circuitry for treating analog signals, and a multitude of other items. For digital processing, the setup often allows an increased communication bandwidth between logic on the one hand and memory on the other hand, than between the overall circuit and the environment, both in terms of data path width and also in terms of bit rate per wire. Similar arguments apply to situations where at least part of the operations are analog. In general, the memory to a large extent is isolated from the chip's surroundings. Furthermore, in contradistinction with stand-alone memory arrays, the embedded array often has a much larger number of I/O bit terminals than the overall chip has available data pins. Hence, immediate access to the array is often unfeasible.

SUMMARY TO THE INVENTION

Furthermore, due to the large number of test patterns required, parallel-to-serial conversion of the complete response patterns for external verification would appreciably slow down the execution of the test. On the other hand, restricting to an inexpensive on-chip pass/fail determination, such as through a signature-generating mechanism or through a "halt on first fault", would not allow to execute the repair operations.

On the other hand, providing the whole test and repair circuitry on-chip is relatively complicated and hence, expensive, inter alia because the test result should provide on-chip pointers to the various fault locations for repair. Therefore, an improved trade-off should require only moderate extensions of the on-chip facilities, while at the same hand necessitating only little communication with the external world, whilst still providing a lossless compressed response pattern.

In consequence, amongst other things, it is an object of the present invention to provide facilities for generating an abbreviated test result, based on the recognition that many tested addresses, even if faulty, will result in identical fault response patterns, and therefore would allow the use of certain compression or extraction procedures without loss of information.

Now therefore, according to one of its aspects, the invention is characterized according to the characterizing part of claim 1. The invention also relates to a memory-based device being arranged for implementing a method as claimed in claim 1. Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
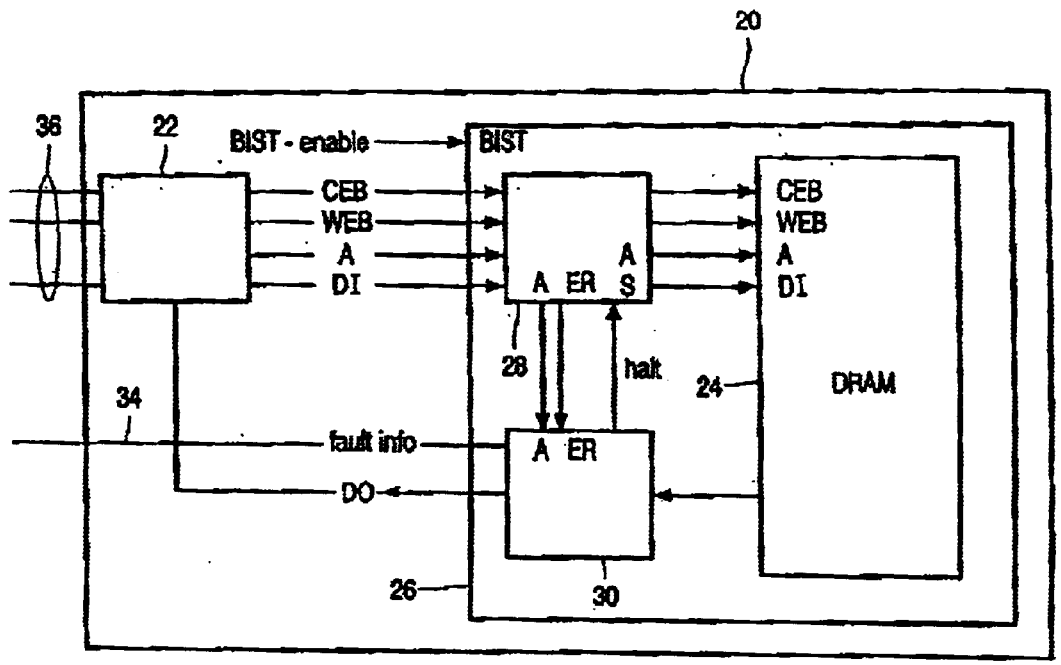
FIG. 1, an integrated circuit architecture embodying the present invention.

FIG. 1 shows an exemplary integrated circuit architecture embodying the present invention. The integrated circuit chip 20 has been provided with external pins or bonding pads shown as bundle 36, which may comprise digital data, analog signal, control, and power channels arranged in various sub-bundles of appropriate path width and amplitude ranges. Hereinafter, various power and control interconnections are considered standard, and have not been represented and disclosed in detail. The same applies to the operation of various basic electronic memory features. Now often, a relatively large part of the chip area is used by RAM 24, that may be based on an arbitrary technology, such as SRAM, DRAM, or other.

Block 22 symbolizes other functionality than memory, and may comprise processor means of an arbitrary character, or other another functionality. Instead of a more or less standard processor function, block 22 may comprise non-memory functionality of any applicable nature, such as single-purpose sequential logic circuitry, analog signal handling, programmable logic array, and other that is generally not based on a layout from uniform cells as memory. However, even this feature should not be considered as an express restriction; the main point being that block 22 is "other than the memory to be tested". The memory under test may be distributed over a plurality of physically and/or logically distinct arrays, which feature has not been shown for clarity.

Now, in non-test condition functionality 22 converses with memory 24 in that blocks 28, 30 are controlled in a transparent mode, so that the signals Chip Enable Bar CEB, Write Enable Bar WEB, Address A, Data In DI, and Data Out DO travel substantially unimpeded.

As shown in the embodiment, block 22 communicates unidirectional and/or bidirectional data and control signals with external circuits not shown on bundle 36, which communication may have such constitution as generally governed by the inherent facilities provided within block 22. Furthermore, line 34 communicates fault info that may in principle also run through block 22. Now, it is generally expensive to lead all test response lines immediately to an environment. It is an object of the instant invention to allow providing an external device with compressed information only in order to generally highly diminish the data stream with respect to the communicating of a full bitmap, but still to allow such external device to precisely decide on the repair measures that must be taken, if feasible.

Memory 24 has been provided with BIST functionality located in block 26, in particular through blocks 28 and 30. By itself, Built-In Self Test memory devices have been disclosed in U.S. Pat. No. 5,568,437 assigned to VLSI Technology, Inc. Various features of the present invention distinguish however in advantageous manners, taken either in isolation or in combination, over this reference. In the first place, the present invention allows to continue testing automatically once a particular fault signalization has been provided to the external devices. Second, all available fault information can be automatically signaled to an external device, regardless of the actual internal spacing between various faults occurred. Third, the facilities necessary for the present invention are extremely restricted if not minimal. It should be noted that the present test methodology is directed to mass testing that furthermore must pinpoint all detected faults.

Figure 1A:
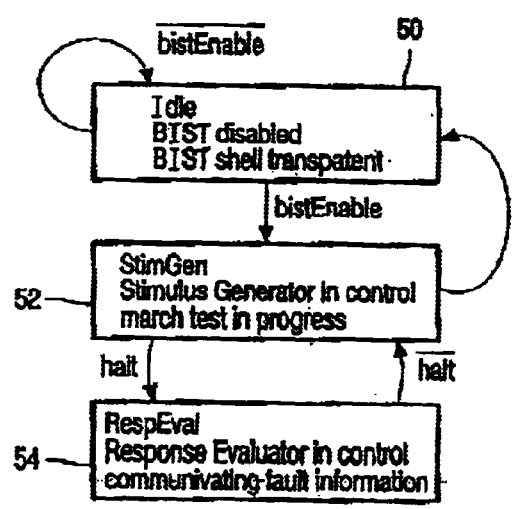
FIG. 1A, the operation modes of the architecture of FIG. 1.

FIG. 1A shows the operation modes of the architecture of FIG. 1. In block 50, control signal bistEnable controls the normal mode of operation: the BIST is idling, the various active items of the BIST are disabled, and the BIST shell is transparent, notably blocks 28 and 30, so that at most a very small influence is effected on the signal transfer. This state may prevail a long time, in particular after the manufacturing test procedures have been terminated. Actuation of the bistEnable signal steers the system to modes of operation 52, 54. In the mode StimGen 52, Stimulus Generator 28 is in control, and the memory test is in progress, such as according to a so-called March Test. This test produces a sequence of address A and data DI pairs, that are presented to memory 24, to eventually result in a corresponding sequence of data out DO from memory 24. Moreover, Stimulus Generator 28 sends the address A and an associated expected response ER to Response Evaluator 30. Generally although not restrictively, the expected response ER is identical to an associated data DI that had most recently been written into this address. Note furthermore, that a sequence of DI words for a series of addresses may be mutually identical. Now, data out DO received in block 30 from memory 24 are compared in Response Evaluator 54 with the appropriate data. Note that a complete multi-address test sequence will be disclosed with respect to FIG. 2. If the comparison does not find a discrepancy between the Data Out and the expected response, the halt signal from Response Evaluator 30 remains non-asserted, and the next test cycle proceeds. However, if the comparison finds a discrepancy, the halt signal from Response Evaluator 30 becomes asserted, and the next test cycle is suspended. In block 54, Response Evaluator 30 gets in control for communicating an appropriate fault information for eventual usage outside chip 20, so that this information may subsequently be used to control the repair process. If the communication is complete, the halt signal is de-asserted again, so that the testing can continue in its pre-specified manner, and will eventually be completed. The present invention does not specify a physical address sequence, nor the information content of a test pattern, as such is proper to the specific test applied.

Figures 2, 3A, 3B:
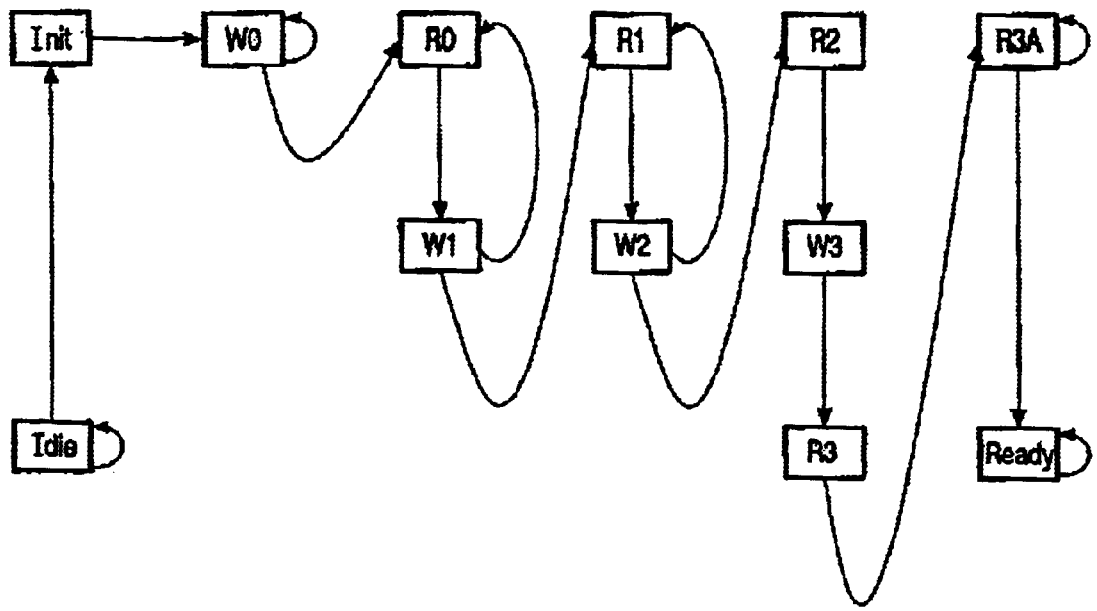
FIG. 2, a finite state machine organized for executing a 9N March Memory Test.
FIGS. 3A and 3B, an example of a fault map and associated fault information.

FIG. 2 shows a finite state machine organized for executing a 9N March Memory Test. For simplicity, only the states have been shown. After Initialization, words with content W0 are written in a sequence of cycles, usually for all applicable addresses, and each cycle pertaining to one single word location. Next, a sequence of locations is read in action R0, pertaining to all or to a fraction of those written earlier, to intentionally produce word W0 again, whilst in the same addressing operation cycle writing word W1 into the word location in question. These read/write cycles are then executed once more for a third data content, indicated as R1/W2. Next, these cycles are then executed once more for a fourth data content according to R2/W3, the latter being read again immediately after writing without further address changing, as indicated by R3. Next, all words are read once more as indicated by R3A, for checking the actually stored content. This is the last step to arrive at 9 steps in total per address location. The diagram is completed with a Ready state and with an Idle state. The 9N march test schedule is one of several test schemes presently in use, and the present invention is not directed to such test scheme in particular. In fact, the invention is likewise applicable if the addressing sequence were changed, if it were different during reading from writing, and if the successive data words written in a sequence would be mutually different by pre-specified bit patterns.

FIGS. 3A and 3B show an example of a fault map, and an associated lossless compressed signalization pattern, respectively. The fault map is the logical fault map as depending on the address sequence used. The small memory as shown in the example has only 13 rows or words numbered from 1 to 13, of only six bits or columns each numbered from 1 to 6. As shown by "ones" in the example, the fault map of the example has one faulty column (#2), one faulty row (#9), and one random fault bit in row #5, column #4. The logic sequencing of the present test goes universally from the top row to the bottom row, but this is no restriction. Note that the overall test may use combinations of different address sequences. The evaluating of the fault patterns proper will be discussed with reference to FIG. 4. Now, block 30 in FIG. 1 will successively find the various faults as shown. For usage externally to the chip under test, in the present embodiment, the first row is signalized in full, and supplemented with a leading signaling "1" bit to show presence of at least one non-conforming bit that signals a fault. As long as subsequent rows will present an identical fault pattern, that by itself may be arbitrary, the response signalization restricts to a leading "zero" bit, whereas the remainder of the actual row is suppressed. However, the fifth row has a different fault pattern through the single random fault bit, and therefore gets an extended signalization just as the first row. In a first embodiment, this pertains to transmitting the complete fault pattern. The sixth row now has again a different fault pattern in that it does not have the above random bit fault, and therefore leads once more to the extended response signalization just as the first row. The seventh and eighth rows have the same fault pattern again and restrict to signaling only the leading "zero". The ninth row has a row error and leads again to the extended signalization just as the first row, in that the complete fault pattern is transmitted. The tenth row does not have this row error and in consequence presents again the same extended signalization as the first row and has its complete fault pattern transmitted. This fault pattern is identically repeated in the final three rows and so they get only the leading zero. As shown, the complete fault bit map would require communicating 6×13=78 bits. The embodiment of the invention shown limits this to only 43 bits, or about a 50% saving. For large memories of A rows, B columns and C rows with faults such as present in the example, the compressed response signalization in this embodiment restricts to about A+B+2BC bits, against AB bits for a complete fault map. For other fault layouts than the one shown, the reduction may be different, also, the analytical expression could be rather different.

Figure 4:
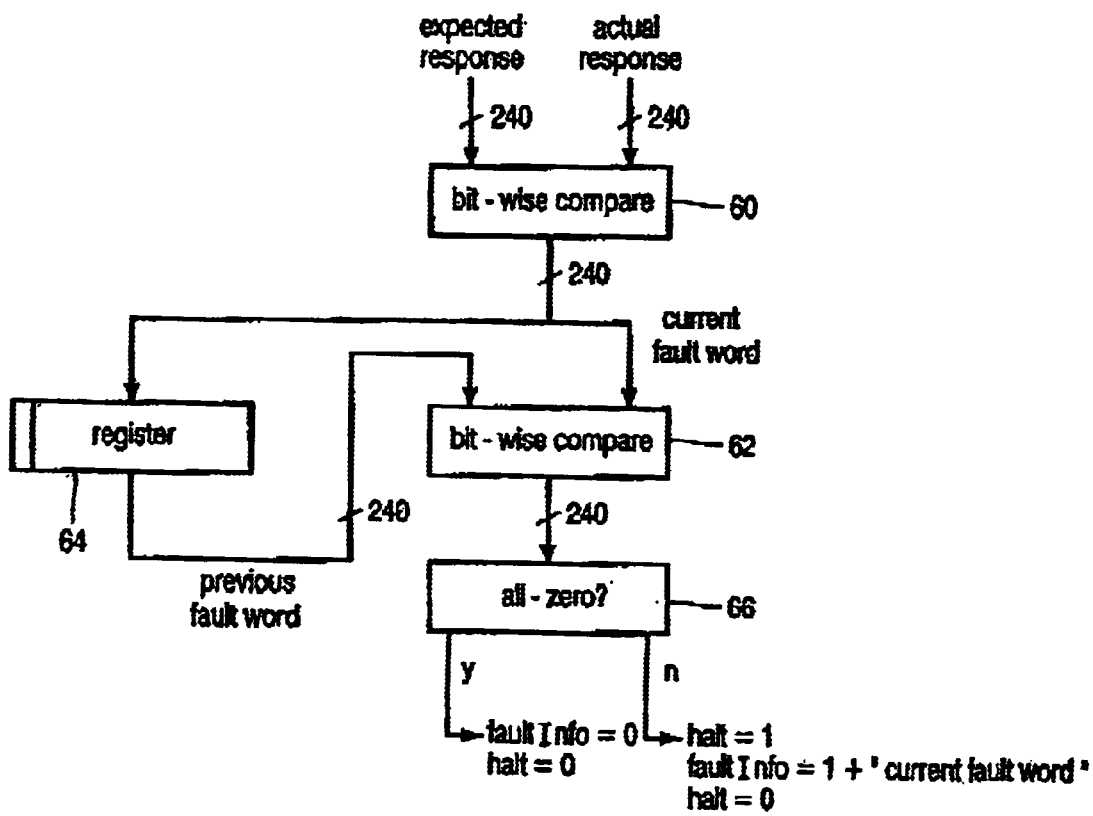
FIG. 4, a response evaluator embodiment.

FIG. 4 shows a response evaluator embodiment for use with FIGS. 3A, 3B. For simplicity, synchronization or other applicable control of the circuitry has not been shown. At the top of the Figure, the expected response pattern and actual response pattern in the current embodiment both have a length of 240 bits, and to for reaching a high speed, are bit by bit compared in parallel in block 60. The comparison produces for the embodiment a 240 bit current fault word that for producing a delay of one cycle is stored in register 64, and is furthermore in block 62 compared with the previous fault word, which yields a 240 bit difference vector. In block 66 this vector is checked for an all-zero pattern. If yes, the halt signal remains non-asserted at "0", and the fault information for the current address is a compressed response "0". If the check does not detect an all-zero pattern, the halt signal gets asserted at "1", and the fault information for the current address is a full response through signaling a fault information "1" and the current fault word. It would be clear that the complete fault data will only be outputted in exceptional situations. Note furthermore, that absence of a fault detection for a single address and pattern may still result from a fault that remains undetected for the pattern in question, such as a stuck-at fault.

As is clear from FIG. 3B, in many cases rows that do not conform to the preceding row will occur in pairs, such as the ninth and tenth rows that both do not conform to their respectively immediate predecessor, although the tenth row is identical to the eighth. This feature would allow to further compress the response signalization by assigning a specific leading code thereto, such as "01". In the present format, this would necessitate one extra bit per row (+13), and save two six bit full responses (−12). In a memory with longer rows however, there would be extra savings. This feature would however necessitate to buffer the fault pattern for one extra row period in the arrangement of FIG. 4. Another procedure would be to compare three successive fault patterns, and output compressed signalization for a particular fault pattern whilst also taking into account a later detected fault pattern.

The procedure according to the foregoing may be further extended as follows. The tester, because lossless compressed response signalization patterns may occur in long strings, will then for a pre-determined period receive only a single bit per clock cycle. Even if some faults will be detected, the overall run will take only little more time than the minimum. It is possible to estimate this extra time for various fault patterns that are just repairable, and thereby estimate the maximally feasible test time. Now, memories of which the BIST procedure did not complete within such estimated time length may be considered unrepairable, so that the test in question may be aborted and the circuit be scrapped. For simplicity, this extra check has not been shown in the diagrams. The choice of the maximum run length is a relevant parameter. For example, in FIG. 3B, each row fault not lying on the first row will produce two non-extracted signalizations. The same applies to a random error. A set of column faults, each represented by a full fault map column of "ones" will collectively produce one non-compressed signalization. Memory design should then specify a range of maximally repairable fault patterns, each pattern combined with the resulting signalization bit length. The maximum value of this length, at a certain risk for being too pessimistic, may specify a somewhat lower value, such as 10% lower, and should apply for setting the above described maximum threshold signalization length. Note that anyway, the length of the overall signalization may not exceed the memory capacity of the external tester.

Further to the above, it is possible to still more lower the amount of data produced by the response evaluator in the case of predetermined non-correspondence between the earlier and the later fault pattern. As can be seen in FIG. 3B, many non-compressed response signalization patterns comprise only one or only a few "1" bits. The amount of information transmitted may then be lowered by a differential coding feature that only specifies the difference between the actual non-compressed signalization and an immediately preceding non-compressed signalization. In FIG. 3B, this would lead to a one-out-of six for rows 1, 5, and 6, combined with a "full" pattern for rows 9 and 10. This would lower the number of bits from 13+30=43 to about 13+3×3+2×6=34. For larger memories the savings are greater. For non-uniform column faults, the savings are less for the same array size. Again such could necessitate extra leading code bits. Furthermore, other types of coding for discerning among non-corresponding fault patterns would be feasible as well.

A further feature is the defect-oriented address ordering. This feature is based on the fact that for March Testing the logic address ordering can in principle be arbitrary. This degree of freedom may be used to choose an address order in such manner that many successive addresses will have the same fault pattern. Such choosing may be done without knowing the actual faults. For example, because bitline faults will generally be the most likely ones, the address order of a March Test may be chosen such that the test marches successively along the addresses that share physical bit lines of the memory. Note that the physical address within the memory array(s) need not be identical to the logical address given by the address bits. In case of a failing bit line, this will then lead to communicating only a single full response signalization for that particular bit line failure. In particular, it has been found that for certain memory technologies, column errors will have the greatest probability.

Generally, the reducing of fault signalization means that for a given run length, the bist will be able to complete on more memories, and hence, the probability for unjustified assessing of "unrepairable" will be reduced.

What is claimed is:

1. A method for testing a memory array, comprising:
   interfacing said memory array to a stimulus generator and a response evaluator,
   in a non-test conditions steering said stimulus generator and said response evaluator in a transparent mode,
   in a test condition, steering said stimulus generator and said response evaluator in a stimulus generating mode and a response evaluating mode respectively, and
   in a subsequent array repair condition, allowing at least one of row-based repair intervention and column-based repair intervention,
   wherein in the test condition, said evaluator:
   evaluates correspondence between successive fault patterns, and
   provides a fault response signalization to external circuitry for, based on a predetermined correspondence between an earlier fault pattern and a later fault pattern, signalizing one of said two patterns only in a form of a lossless compressed response pattern, and
   wherein the method allows automatically continued testing once the fault response signalization is provided to the external circuitry.

2. A method as claimed in claim 1, further comprising, in said test condition, alternating between (1) said stimulus generating mode for said stimulus generator and said response evaluating mode for said response evaluator, and (2) a suspended mode for said stimulus generator and response signalizing mode for said response evaluator, wherein said response evaluator provides the fault response signalizaion during the response signalizing mode.

3. A method as claimed in claim 1, wherein said earlier and later fault patterns are temporally contiguous.

4. A method as claimed in claim 1, wherein said predetermined correspondence implies that said earlier and later fault patterns are mutually identical.

5. A method as claimed in claim 4, wherein said earlier and later fault patterns share one or more column faults.

6. A method as claimed in claim 1, wherein said compressed response pattern is independent of an actual fault pattern.

7. A method as claimed in claim 1, wherein one of the successive fault Patterns comprises a noncompressed response pattern that is formed based on differential coding with respect to another of the successive fault patterns.

8. A method as claimed in claim 1, wherein said stimulus generator presents a sequence of memory addresses that are ordered in view of raising a probability for acquiring a sequence of corresponding fault patterns.

9. A memory-based device comprising:
   an interface for interfacing a memory array to a stimulus generator and a response evaluator,
   a steering circuit for:
      in a non-test condition, steering said stimulus generator and said response evaluator in a transparent mode, and
      in a test condition, steering said stimulus generator and said response evaluator in a stimulus generating mode and a response evaluating mode respectively,
   wherein said evaluator comprises:
      a correspondence evaluating device operative on successive fault patterns, and
      a response generator operable to provide a fault response signalization to external circuitry for, based on a predetermined correspondence detected by said evaluating device between an earlier fault pattern and a later fault pattern, signalizing one of said fault patterns only in a form of a lossless compressed response pattern, and
   wherein the memory-based device automatically continues testing once the fault response signalization is provided to the external circuitry.

10. A device as claimed in claim 9, wherein said evaluating device comprises storage with a storage depth of one fault pattern.

11. A device as claimed in claim 9 wherein said memory array is an embedded memory on an integrated circuit chip provided with both memory functionality and further functionality.

* * * * *